United States Patent [19]

Akazawa

[11] Patent Number: 5,203,981
[45] Date of Patent: Apr. 20, 1993

[54] VACUUM-TREATMENT APPARATUS

[75] Inventor: Moriaki Akazawa, Itami, Japan

[73] Assignee: Mitsubishi Denki Kabushiki Kaisha, Tokyo, Japan

[21] Appl. No.: 835,331

[22] Filed: Feb. 14, 1992

[30] Foreign Application Priority Data

Jun. 5, 1991 [JP] Japan .................................. 3-133905

[51] Int. Cl.$^5$ ............................................. C23C 14/34
[52] U.S. Cl. ........................... 204/298.15; 204/298.23; 156/345; 118/503
[58] Field of Search .................. 204/298.15, 298.23, 204/192.12, 298.31; 156/345; 118/500, 503

[56] References Cited

U.S. PATENT DOCUMENTS

| | | | |
|---|---|---|---|
| 4,473,455 | 9/1984 | Dean et al. | 204/298.15 |
| 4,522,697 | 6/1985 | Dimock et al. | 204/298.15 X |
| 4,535,834 | 8/1985 | Turner | 118/503 X |
| 4,869,801 | 9/1989 | Helms et al. | 204/298.15 |
| 4,944,860 | 7/1990 | Bramhall, Jr. et al. | 204/298.15 X |
| 5,006,536 | 3/1992 | Cathey, Jr. | 156/345 X |
| 5,037,262 | 8/1991 | Moll et al. | 204/298.15 X |

FOREIGN PATENT DOCUMENTS 53-123669 10/1978 Japan .
55-90228 7/1980 Japan .
56-131931 10/1981 Japan .

*Primary Examiner*—Nam X. Nguyen
*Attorney, Agent, or Firm*—Leydig, Voit & Mayer

[57] ABSTRACT

A vacuum-treatment apparatus employs a magnetically driven clamp which uses repulsive and attractive forces between magnets. The clamp mechanism is simplified, maintenance of the apparatus can be easily performed, and the surfaces which mechanically contact one another are decreased as much as possible so that a vacuum-treatment apparatus which generates less dust is obtained.

6 Claims, 2 Drawing Sheets

5,203,981

VACUUM-TREATMENT APPARATUS

BACKGROUND OF THE INVENTION

1. Field of the Invention

The present invention relates to a vacuum-treatment apparatus, in particular, to a vacuum-treatment apparatus used in a semiconductor production process, such as dry etching, CVD, deposition, sputter deposition and the like in which a specimen is treated while pressing it against a specimen table.

2. Description of the Related Art

FIG. 2 is a schematic sectional view showing a dry etching apparatus, a conventional vacuum-treatment apparatus. In FIG. 2, a reaction chamber 1 of the dry etching apparatus is an airtight container which is provided with a gas-feeding entrance 2 and an exhaust port 3. An upper electrode 4 and specimen table 5, acting as a lower electrode, are provided at upper and lower portions of the reaction chamber 1. These electrodes are electrically connected and an RF generator 6 and a coupling capacitor 7 are connected in series with the electrodes. A specimen 8, i.e., a semiconductor wafer, is disposed on the surface of the specimen table 5, the outside of which is surrounded with a clamp ring 9 and clamp pins 10 which make the clamp ring move up and down. A clamp driving unit 11 which operates the clamp pins 10 is positioned exterior to the specimen table 5. A detailed description of the mechanism of the clamp driving unit 11 is omitted.

The conventional dry etching apparatus is constructed as described above. At first the specimen 8 is placed onto the specimen table 5 while the clamp ring 9 is in a raised position. The clamp pins 10 are moved down by the clamp driving unit 11. The clamp ring 9, which is mounted on the clamp pins 10, contact the outer circumference of the specimen 8. The specimen 8 is secured to the specimen table 5 by the desired pressure which is controlled by the power of the clamp driving unit 11. A reactive gas is fed into the reaction chamber 1 through the gas-feeding entrance 2 and an adequate quantity of the gas is exhausted from the exhaust port 3 so that the inside of the reaction chamber 1 is maintained at a predetermined pressure.

An RF voltage is applied by the RF generator 6 between the specimen table 5, acting as a lower electrode, and the upper electrode 4. Matching of impedance is performed by the coupling capacitor 7 so that a plasma of the reactive gas is generated in the reaction chamber 1 and the surface of the specimen 8 is etched. Then, the back of the specimen 8 is firmly pressed to the surface of the specimen table 5 by the pressure of the clamp ring 9. The heat transfer efficiency between the specimen 8 and the specimen table 5 is high and heat from the specimen 8, raised by the plasma, is absorbed into the specimen table 5. If an operator is required to set the temperature of the specimen 8 higher or lower than room temperature, he sets the temperature of the specimen table 5 at a desired temperature beforehand. The temperature of the specimen 8 can be changed to a desired value in a short time because of thermal transfer efficiency.

In the dry etching apparatus, the surface of a specimen, such as a silicon wafer, is etched by the plasma of the reactive gas which is generated in the reaction chamber 1 and the temperature of the specimen 8 rises during the process because of heat transfer from the plasma. The dry etching apparatus has a fundamental problem in that various characteristics such as the etching rate, uniformity of the etching rate on the surface of the semiconductor wafer and various etching rates according to the difference of materials etched, change with a rise in the temperature of the specimen 8. Superior characteristics are manifested when the specimen 8 is set at an optimum temperature higher or lower than room temperature. As described above, temperature control of the specimen 8 is a very serious problem and an attempt is made to control the temperature of the specimen 8 by controlling the contact between the specimen 8 and the specimen table 5.

In the above-described vacuum-treatment apparatus, in order to control the temperature of the specimen 8, i.e. to make the specimen 8 the same temperature as the specimen table 5, the specimen 8 is pressed against the specimen table 5 by using a mechanism in which the clamp pins 10 are moved up and down by the driving unit. Therefore, the construction of members such as clamp pins 10 and holes, through which the clamp pins 10 pass, is complicated and because there are many surfaces mechanically in contact one another, the amount of dust-generation is increased. This is a problem of semiconductor manufacturing apparatus. Such dust-generation must be sufficiently controlled in future semiconductor manufacturing apparatus which will require more precision.

SUMMARY OF THE INVENTION

The present invention has been achieved to solve such a problem. An object of the present invention is to provide a vacuum-treatment apparatus in which a clamp mechanism is simplified, the maintenance of the apparatus can be easily performed and the surfaces, which mechanically contact one another, are decreased as much as possible, thereby generating less dust.

The present invention provides a vacuum-treatment apparatus which comprises: a vacuum container; a specimen table positioned in the vacuum container for supporting a specimen thereon; a clamp ring, including an embedded permanent magnet for pressing a specimen against on the specimen table; and an electromagnet for generating a magnetic field of lifting the clamp ring perpendicularly to the specimen table or for pressing the specimen against the specimen table.

DETAILED DESCRIPTION OF THE PREFERRED EMBODIMENT

Figure 1:
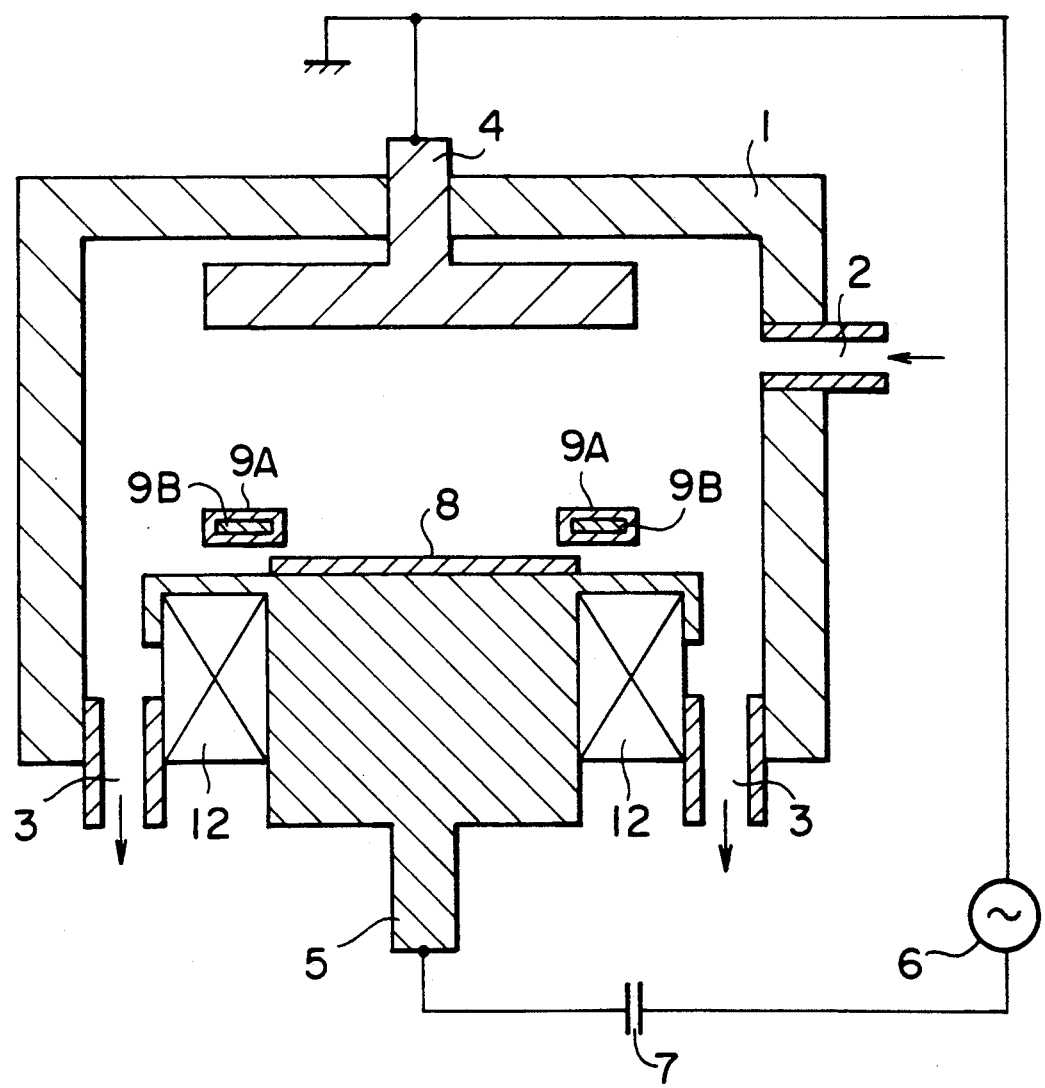
FIG. 1 is a schematic sectional view of a dry etching apparatus of one embodiment of the present invention.
Figure 2:
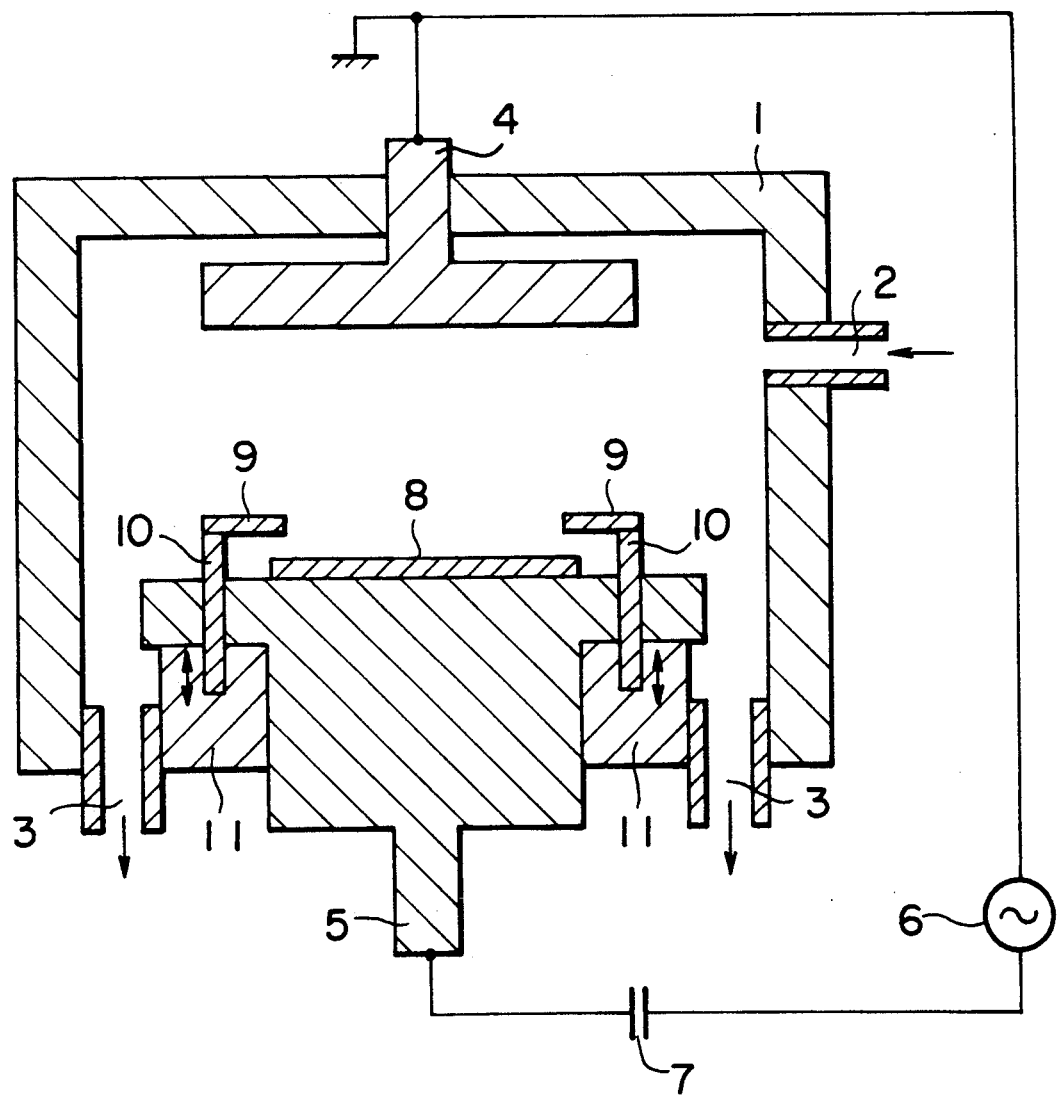
FIG. 2 is a schematic sectional view showing a conventional dry etching apparatus.

FIG. 1 is a schematic sectional view showing a vacuum treatment apparatus, i.e., a dry etching apparatus, according to one embodiment of the present invention. In the drawing, the same reference numerals as those used in FIG. 2 represent the same or corresponding parts. As seen in FIG. 1, a permanent magnet 9B is embedded in the clamp ring 9A. The permanent magnet 9B is positioned so that its upper surface serves as a north pole and the lower surface serves as a south pole. An electromagnet 12 is embedded in the specimen table 5. The coil of the electromagnet 12 is concentric with the specimen table 5, and the polar direction of the electromagnet 12 can be changed. That is, the upper surface of the electromagnet 12 can be a north pole and the lower surface of the electromagnet 12 can be a south pole. Also, the magnetic force of the electromagnet 12 can be controlled by controlling the amount of current which is carried to the coil.

In the above-described dry etching apparatus, at first the specimen 8 is placed precisely on the center of the specimen table 5. The current flowing through the coil is controlled so that the upper portion of the electromagnetic 12, which is embedded within the specimen table 5, serves as a south pole. In this way, the clamp ring 9A is raised to a suspended position by the repulsive force of the magnets. After the magnetic force of the electromagnet 12 is gradually reduced to zero, current is gradually applied to the coil increasing the amount of the current so that the upper surface of the electromagnet 12 serves as a north pole. This condition is maintained and the coil attains the desired magnetic force. Then, the specimen 8 is interposed between the clamp ring 9A and the specimen table 5 with the desired pressure produced by the attraction of both magnets.

When the temperature of the specimen table 5 differs from the room temperature, etching is delayed until the temperature of the specimen 8 becomes equal to the temperature of the specimen table 5. In this way, the temperature of the specimen 8 can be constantly and precisely adjusted to the temperature of the specimen table 5 without a temperature difference between them. If the specimen 8 is maintained at a high temperature, the specimen 8 may be pressed to the specimen table 5 with little pressure. If the specimen 8 is maintained at a low temperature, the specimen 8 is pressed to the specimen table 5 with firm pressure so that the heat of the specimen 8 may be sufficiently transferred to the table 5. The specimen 8 can be maintained at the desired temperature by controlling the pressure.

As reactive gas such as $Cl_2$ and $SF_6$ is introduced into the reaction chamber 1 through the gas-feeding entrance 2 and gas is exhausted from the exhaust port 3. An RF voltage, which is controlled by the RF generator and the coupling capacitor 7, is applied between the upper electrode 4 and the specimen table 5 acting as a lower electrode. A plasma of the reactive gas is generated so that dry etching is performed on a specimen 8 such as a polysilicon film. Finally, the specimen 8 is withdrawn from the reaction chamber 1 in the same manner as it was placed in the apparatus and thus the entire operation is completed.

Although the permanent magnet 9B and the electromagnet 12 may be operated with a polarity reversed to the abovedescribed embodiment, the same effect as described above can be obtained. The electromagnet 12 is positioned inside the specimen table 5 but may also be positioned, for example, at the periphery thereof.

An embodiment of the dry etching apparatus according to the present invention is described above. The present invention can be similarly applied to a vacuum-treatment apparatus such as dry etching, CVD, sputter deposition and the like in which a specimen is treated by pressing it against a specimen table.

As described above, the present invention can decrease the amount of dust-generation and the mechanism for loading and unloading the specimen can be easily constructed without pins for securing the clamp ring. The present invention is efficient in precisely controlling the temperature of the specimen and in maintaining the predetermined temperature by controlling the pressure of the clamp ring.

What is claimed is:

1. A vacuum-treatment apparatus comprising:
   a vacuum container;
   a specimen table, positioned in said vacuum chamber, for supporting a specimen;
   a clamp ring including an embedded permanent magnet for pressing a specimen disposed on said specimen table; and
   an electromagnet for generating a magnetic field for selectively lifting said clamp ring perpendicularly from said specimen table and urging said clamp ring against a specimen disposed on said specimen table.

2. The vacuum-treatment apparatus as claimed in claim 1 wherein said vacuum container includes a gas-feeding entrance for introducing a reactive gas into said vacuum container and an exhaust port for exhausting gas from said vacuum container.

3. The vacuum-treatment apparatus as claimed in claim 1 wherein said electromagnet is disposed outside said specimen table.

4. The vacuum-treatment apparatus as claimed in claim 1 wherein said vacuum-treatment apparatus is a dry etching apparatus.

5. The vacuum-treatment apparatus as claimed in claim 1 wherein said vacuum-treatment apparatus is a CVD apparatus.

6. The vacuum-treatment apparatus as claimed in claim 1 wherein said vacuum-treatment apparatus is a sputtering apparatus.

* * * * *